United States Patent [19]

McDonald

[11] 4,262,412
[45] Apr. 21, 1981

[54] COMPOSITE CONSTRUCTION PROCESS AND SUPERCONDUCTOR PRODUCED THEREBY

[75] Inventor: William K. McDonald, Salem, Oreg.

[73] Assignee: Teledyne Industries, Inc., Los Angeles, Calif.

[21] Appl. No.: 42,893

[22] Filed: May 29, 1979

[51] Int. Cl.³ .......................................... H01L 39/24
[52] U.S. Cl. ................................ 29/599; 174/126 S; 174/126 CP; 428/609; 428/660; 428/661; 428/662; 428/642; 428/646; 428/615
[58] Field of Search ...................... 29/599, 163.5 F; 428/609, 615, 660, 642, 646, 661, 662; 174/126 CP, 126 CS, 126 S

[56] References Cited

U.S. PATENT DOCUMENTS

| | | |
|---|---|---|
| 3,123,900 | 3/1964 | Millar .......................... 29/163.5 F X |
| 3,175,893 | 3/1965 | Meretsky ........................... 428/642 |
| 3,208,131 | 9/1965 | Ruff et al. ................... 29/163.5 F X |
| 3,345,734 | 10/1967 | Sowko ............................... 428/609 |
| 3,466,733 | 9/1969 | Pajak ........................... 29/163.5 F X |
| 3,490,718 | 1/1970 | Vary ............................... 29/157.3 R |
| 3,579,800 | 5/1971 | Packard ............................. 428/660 |
| 3,625,662 | 7/1971 | Roberts et al. .................... 428/662 |
| 3,698,863 | 10/1972 | Roberts et al. .................... 428/660 |
| 3,997,714 | 12/1976 | Letellier et al. .................... 29/599 |

FOREIGN PATENT DOCUMENTS 9228 of 1911 United Kingdom ................ 29/163.5 F Primary Examiner—Charlie T. Moon
Assistant Examiner—V. K. Rising
Attorney, Agent, or Firm—Shoemaker and Mattare, Ltd.

[57] ABSTRACT

A method of producing composite rod or wire of increased strength and fineness wherein the composite is formed by reducing a lamina of two metals which have been rolled to form a cylindrical billet wherein one of the metals is in expanded form. The composite produced can be encased in copper and fabricated to produce a superconductor. Alloys contemplated for producing superconductors are $Nb_3Sn$, $Nb_3Ga$, $Nb_3Ge$, $Nb_3Si$, Nb-Ti, $V_3Ga$, $V_3Si$, $V_3Sn$, $V_3Al$, and $V_3Ge$ laminated on bronze, Al, Cu, Ta, or combinations thereof.

9 Claims, 3 Drawing Figures

COMPOSITE CONSTRUCTION PROCESS AND SUPERCONDUCTOR PRODUCED THEREBY

BACKGROUND OF THE INVENTION

1. Field of the Invention

This invention relates to a method of producing composites capable of being used as superconductors. More specifically, it deals with wires composed of extremely fine filaments of niobium and niobium alloys and a process for producing the same.

2. Description of the Prior Art

In the past, composites for the production of rods, cables, or wires were produced by laminating the metals or combining them in some way and subsequently fabricating them to final dimensions. Superconductors of niobium alloys have been produced in this way with various drawbacks.

As an example, methods of producing niobium tin wire having fine continuous filaments have been costly and unreliable because niobium rods are used for forming the conductor filaments. The components for construction have dimensions of $\frac{1}{8}''$ diameter or larger, thus requiring a great reduction to produce a wire with one micron diameter filaments. The wires are usually produced by placing the niobium rods in a bronze billet and extruding the billet several times to reach a certain size filament of the niobium rod. This wire produced is rebundled with other wires and again extruded. In the diffusion process whereby the tin in the bronze is diffused into the niobium, large Kirkendall voids are produced in the bronze when the niobium filaments are of large dimensions, over 10 microns. Large Kirkendall voids are detrimental to the wire.

Further, because these wires produced by the prior art processes are composed of individual and separate filaments, these filaments tend to break during the fabrication process because of being extruded from such a large diameter to such a small diameter. When individual filaments break, they cause a weakening of the bulk wire and eventually can cause the wire to break, thus decreasing the yield of usable product.

In normal present day processes, it is necessary to fabricate the wire billets through extrusion processes and to re-extrude several times to reach final dimensions where the wire is drawn through dies. Each of these extrusions is very hard on the filaments and is also very expensive to perform. It is, therefore, desirable that there be found another method of producing composites capable of being fabricated to form wires having fine niobium alloy filaments which are free of the detriments of past processes, i.e., expense and filament breakage.

BRIEF SUMMARY OF THE INVENTION

Objects of the Invention

It is, accordingly, one object of the present invention to provide a process for producing a composite rod, cable, or wire having greater strength and stability.

A further object of the present invention is to provide a process for producing a superconductor of a niobium or vanadium alloy using expanded niobium or vanadium.

Another object of the present invention is to provide a process for producing wires having niobium alloy filaments of very fine size by a process requiring less extrusion and greater yield of product.

A still further object of the present invention is to provide a process of producing superconductors of alloys including, but not limited to, $Nb_3Sn$, $Nb_3Ga$, $Nb_3Ge$, $Nb_3Si$, Nb-Ti, $V_3Ga$, $V_3Si$, $V_3Sn$, $V_3Al$, and $V_3Ge$, whereby the Nb or V in either elemental or alloy form is expanded and laminated onto a backing material of Cu, Al, Ta, Bronze, or combinations thereof and subsequently rolled and fabricated into wires which can also be further fabricated.

These and other advantages of the present invention will become apparent from the following detailed description and drawings.

In accordance with the above objects, it has been found that metal composites of greater strength can be produced by having one layer of the composite in expanded form. Specifically, wires containing niobium or vanadium alloy filaments of extremely fine size can be made with one extrusion, with less breakage and greater strength by using niobium or vanadium in the form of expanded metal.

DETAILED DESCRIPTION OF THE INVENTION

This invention has provided means for making stronger electrical conduits which are not only strong in use, but, more importantly, strong enough to withstand fabrication into various forms, such as rods, cables, wires, etc., which may have several filaments contained therein. This is made possible by using the conductive metal or alloy in an expanded form, laminating the same to another metal and fabricating the same into final form.

Specifically, in the present invention it has been found that many of the problems of the past methods of producing composites, particularly superconductor wires having fine filaments of niobium alloys, such as niobium tin, can be solved by using expanded niobium metal as opposed to niobium rods. This expanded metal has many advantages of prior processes. It allows a greatly increased versatility and composite design, much finer filaments with less reduction required, a uniform conductor cross-section while still having the advantages of a single fine filament. These advantages are attributed to the use of a finer starting material, therefore, requiring less reduction to achieve even finer filaments than prior methods. Because the starting size of the conductor is fine, final dimensions of the superconductor can be sufficiently fine to allow for short reaction times, thereby reducing Kirkendall void formation and utilizing the ductile characteristics of extremely fine filaments of the brittle niobium-tin compound.

By means of the present process, one can produce a long length conductor with fine conductor filaments at a much lower cost than present processes. This is because the starting material is of very fine dimensions requiring less reduction. The conductor produced will have improved resistance to property degradation associated with tensile strain. This is due to the use of a mesh configuration. If one of the filaments breaks, there is still connection with the rest of the filaments in the expanded metal and thus the stresses are distributed to the other supporting filaments. In this way, all of the filaments act in coordination as if they were a single filament with minimized threat of breakage. Because of this decreased threat of breakage, it is possible by the present method to produce long unbroken lengths which are extremely difficult to achieve using present-day methods.

Figure 1:
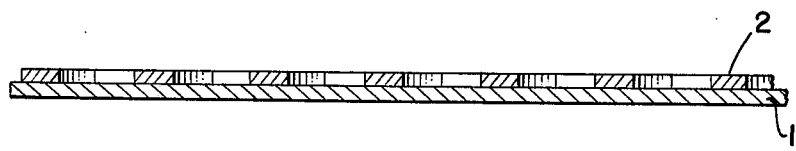
FIG. 1 discloses a cross-sectional view of a lamina consisting of a solid metal layer and an expanded metal layer.
Figure 2:
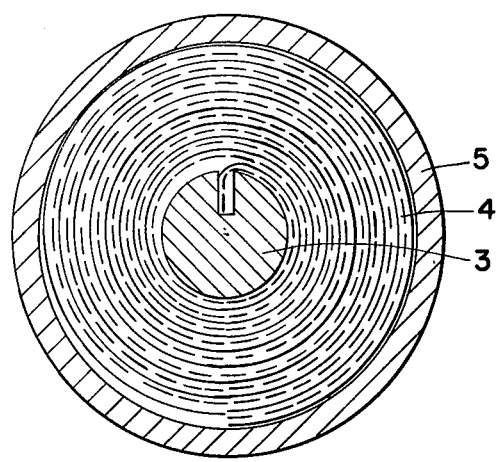
FIG. 2 discloses a cross-sectional of a billet of the lamina of FIG. 1 rolled from the lamina of FIG. 1 around a copper rod and clad in copper.
Figure 3:
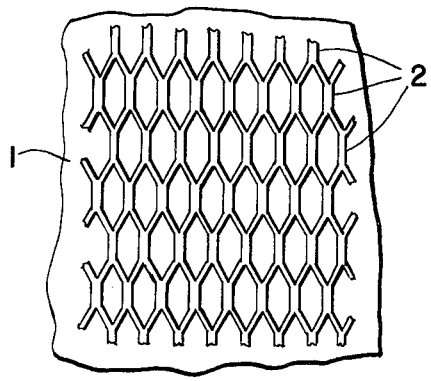
FIG. 3 discloses a top view of FIG. 1 showing the expanded metal layer overlaying the solid metal layer.

In accordance with the present invention, wires can be produced by taking a lamina as shown in FIGS. 1 and 2, wherein a bronze layer (1) is layered with a layer of expanded niobium metal (2). The bronze layer is used to supply tin to the niobium. It has been found that the tin can be diffused into the niobium in this way, and, therefore, the bronze layer is needed so as to diffuse the tin into the niobium and produce $Nb_3Sn$. This method has the desirable reaction kinetics for the solid state diffusion reaction since it is more difficult for the tin to be placed on the niobium and achieve the same. The bronze is of standard specifications and contains anywhere from 10 to 13% tin. This lamina is then rolled like a jelly roll around a copper rod as shown in FIG. 2 and marked 3. The bronze niobium layer (4) is wound around the copper rod (3) and subsequently clad with an outer layer of copper (5), forming a billet having the cross-sectional shown in FIG. 2.

The copper cladding is helpful to facilitate fabrication, making it easy to draw the wire. It further provides cryogenic stability having high thermal conductivity. The wire then can be reduced and drawn into any cross-sectional shape, i.e., round, square, elliptical, or flat.

The expanded metal can be vanadium, niobium, or even niobium-titanium. The other metals may include aluminum, copper, tantalum, or bronze, and may contain a metal to be alloyed with the niobium or vanadium, such as galium, germanium, tin, or silicon. The thicknesses and other qualities of both metals depend on the end product desired.

With regard to the specific example illustrated, wherein ($Nb_3SN$/Bronze), the expanded metal can be of any thickness as can be the bronze. It is desirable to achieve in the lamina before rolling a ratio of bronze to niobium by volume of three to one, respectively. The expanded metal is usually of the thickness of from 0.06 to 0.001", preferably as low as 5 to 15 mills. The bronze is of a thickness necessary to produce a final ratio by volume of about three parts bronze to one part niobium.

The billet formed is extruded and subsequently drawn. It is possible then to rebundle, in the method of the current state of the art, wire produced by this method to further produce wires having finer filaments and more numerous filaments by a subsequent reduction and drawing. The copper surrounding the billet is of sufficient thickness so as not to breakdown and expose the composite elements to the surface to maintain integrity through the reducing and drawing operation. Because of the better qualities of starting with an expanded niobium metal layer, it is possible to go through the reducing steps with much greater yield than present day processes. A specific example of the production of a wire by the present process wherein niobium is laminated to a tin bronze and wrapped around a copper rod and clad with a copper can is as follows:

EXAMPLE 1

One billet has been constructed, 2.375 inch outside diameter × 6 inches long, with approximately 8% Nb by cross-section. The billet was fabricated to 0.020 inch diameter wire by conventional methods, reacted by conventional methods, and shown to have excellent superconducting properties.

TABLE 1

Critical Current (Amps) in 0.020" diameter wire, nominally 8% Nb wire cross-sectional area = $2.0 \times 10^{-3}$ cm$^2$; Superconductor area is 8% of $2 \times 10^{-3}$ cm$^2$ = $1.6 \times 10^{-4}$ cm$^2$ — Final heat treatment at 800° C. for 15 minutes

| Test Temp. (°K.) | Strain (Bend Radius) | OT | 1T | 2T | 3T | 4T | 5T | 6T | 7T | Comment |
|---|---|---|---|---|---|---|---|---|---|---|
| 4.2° K. | 0 | 590A | — | — | — | — | — | — | — | Test Lab #1 |
| 14° K. | 0 | 160A | — | — | — | — | — | — | — | Test Lab #1 |
| 15° K. | 0 | 90A | — | — | — | — | — | — | — | Test Lab #1 |
| 16° K. | 0 | 30A | — | — | — | — | — | — | — | Test Lab #1 |
| 17.6° K. | 0 | 0A | — | — | — | — | — | — | — | Test Lab #1 |
| 4.2° K. | 0 | — | — | 88A | — | 76.5A | 64A | 55A | — | Test Lab #2 |
| 4.2° K. | ⅛"r | 370A | 210A | 151A | 105A | 76A | 61A | 47A | 38A | Test Lab #3 |
| As Drawn wire (no final Heat Treatment) | | | | | | | | | | |
| 11° K. | 0 | 0A | — | — | — | — | — | — | — | Critical Temp. |

A single, unbroken coil nominally 5000' long was produced with Nb filaments having one dimension of one micron. As shown in Table I, the $T_c$ measured on the wire prior to final stage reaction heat treatment is 11° K., about 2° K. higher than pure Nb. This improved $T_c$ over pure Nb is the result of reaction of the Sn from the bronze with the Nb to form very fine $Nb_3Sn$ during processing anneals at 600° C.

As stated above, the alloying elements are usually contained in or on the solid metal layer which is laminated to the niobium or vanadium expanded metal. An exception to this is niobium-titanium, which is capable of being formed as a master alloy and fabricated into an expanded metal layer. The alloying elements, such as galium, germanium, tin, etc., are more capable of being alloyed with the vanadium or niobium by means of diffusion from the lamina layer. As can be seen from the above, these alloys are all capable of being substituted for the niobium, tin, or bronze of the specific example.

As this invention may be embodied in several forms without departing from the spirit or essential characteristics thereof, the present embodiment is, therefore, illustrative and not restrictive, since the scope of the invention is defined by the appended claims rather than by the description preceding them, and all changes that fall within the mete and bounds of the claims or that form their functional as well as conjointly cooperative equivalent are, therefore, intended to be embraced by those claims.

I claim:

1. A method of producing a composite of two metals comprising forming a lamina of the two metals, one metal in expanded form having a mesh or foraminous type configuration, rolling the lamina into a coil to form a billet and subsequently elongating the billet.

2. The method of claim 1 wherein the composite is a conductor formed from an alloy of a metal selected from the group consisting of niobium or vanadium in expanded form and at least one metal selected from the group consisting of bronze, copper, aluminum, and tantalum, and wherein the billet is formed by coiling the lamina around a copper rod and cladding the billet in copper before extrusion and drawing.

3. The method of claim 2 wherein the billet is drawn to form a wire, then combined with other wires formed by the same method and subsequently re-drawn to form a wire.

4. The method of claim 2 wherein the superconductor is formed from an expanded metal sheet laminated to a tin-bronze sheet, rolled around a copper rod to form a billet, cladding said billet in a copper case, and fabricating said billet into a superconductor wire.

5. The method of claim 2 wherein the vanadium and niobium alloys are formed by diffusion of the alloying element from a solid metal layer into the niobium and vanadium expanded metal during fabrication.

6. A method of producing a composite superconducting rod comprising forming a lamina of a layer of expanded metal selected from the group consisting of niobium and vanadium and a sheet of at least one metal selected from the group consisting of bronze, aluminum, copper, and tantalum; said metal sheet containing metal selected from the group consisting of tin, galium, germanium, and silicon, rolling said lamina around a copper rod, cladding the rolled lamina in copper to form a billet, and extruding said billet to form a rod.

7. The method of claim 6 wherein the rod formed has a cross-section selected from the group consisting of round, square, elliptical, and flat.

8. The method of claim 6 wherein the rod formed by claim 6 is further drawn to form a superconducting wire.

9. The method of claim 7 wherein the wire produced in claim 7 is compacted with other wires produced by the same method and subsequently fabricated to form a wire containing superconductor filaments of the same material.

* * * * *